(12) United States Patent
Fukao et al.

(10) Patent No.: US 11,997,797 B2
(45) Date of Patent: May 28, 2024

(54) SETUP CHANGE TASK SETTING DEVICE

(71) Applicant: FUJI CORPORATION, Chiryu (JP)

(72) Inventors: Kazuya Fukao, Toyota (JP); Hiroo Muraoka, Nagoya (JP)

(73) Assignee: FUJI CORPORATION, Chiryu (JP)

(*) Notice: Subject to any disclaimer, the term of this patent is extended or adjusted under 35 U.S.C. 154(b) by 232 days.

(21) Appl. No.: 17/427,726

(22) PCT Filed: Feb. 18, 2019

(86) PCT No.: PCT/JP2019/005852
§ 371 (c)(1),
(2) Date: Aug. 2, 2021

(87) PCT Pub. No.: WO2020/170305
PCT Pub. Date: Aug. 27, 2020

(65) Prior Publication Data
US 2022/0117126 A1 Apr. 14, 2022

(51) Int. Cl.
*H05K 13/08* (2006.01)
*H05K 13/02* (2006.01)
*H05K 13/04* (2006.01)

(52) U.S. Cl.
CPC ......... *H05K 13/0882* (2018.08); *H05K 13/02* (2013.01); *H05K 13/04* (2013.01); *H05K 13/0857* (2018.08); *H05K 13/086* (2018.08)

(58) Field of Classification Search
CPC ...... H05K 13/02; H05K 13/021; H05K 13/04; H05K 13/085; H05K 13/0857; H05K 13/086; H05K 13/0882; Y10T 29/4913; Y10T 29/53174
See application file for complete search history.

(56) References Cited

U.S. PATENT DOCUMENTS

2015/0248314 A1   9/2015   Morita

FOREIGN PATENT DOCUMENTS

| EP | 3 226 669 A1 | 10/2017 |
| JP | 2000-59090 A | 2/2000 |
| JP | 2005-216965 A | 8/2005 |
| JP | 2018-116990 A | 7/2018 |

OTHER PUBLICATIONS

International Search Report dated Apr. 23, 2019 in PCT/JP2019/005852 filed on Feb. 18, 2019, 2 pages.

*Primary Examiner* — Jeffrey T Carley
*Assistant Examiner* — Joshua D Anderson
(74) *Attorney, Agent, or Firm* — Oblon, McClelland, Maier & Neustadt, L.L.P.

(57) ABSTRACT

A setup change task setting device includes a number-of-feeders acquisition section configured to acquire the number of feeders required to be replaced in a wheeled table on which multiple feeders supplying components are installed to be replaceable during a setup change in which a board on which the components are mounted is changed from a current board type to a next board type in a component mounter in which the wheeled table is provided to be exchangeable, a task comparing section configured to compare relative merits of multiple types of setup change tasks in the wheeled table provided in the component mounter based on an acquisition result from the number-of-feeders acquisition section, and a task setting section configured to set any of the multiple types of setup change tasks for the wheeled table based on a comparison result from the task comparing section.

7 Claims, 5 Drawing Sheets

SETUP CHANGE TASK SETTING DEVICE

TECHNICAL FIELD

The present specification relates to a setup change task setting device that sets a setup change task for a wheeled table on which a feeder is installed during a setup change in which a board subjected to mounting work by a component mounter is changed from a current board type to a next board type.

BACKGROUND ART

A technique for mass-producing board products by performing board work on a board on which printed wirings are applied has become widespread. A typical example of a board work machine for performing board work is a component mounter that performs component mounting work. Generally, a component mounter is installed with a replaceable feeder loaded with a reel for supplying a component, and thus provides various types of components. During a setup change for changing a board on which a component is to be mounted from a current board type to a next board type, a wheeled table is used to collectively replacing multiple feeders. One technical example related to such type of wheeled table for supplying a component is disclosed in Patent Literature 1.

Patent Literature 1 discloses a group determination method in which multiple board types that are production targets are divided into multiple groups to which arrangement of feeders is common in a component mounting line in which multiple component mounters are coupled. This group determination method includes a step of calculating an external setup work time required for external setup work for disposing a feeder commonly used in the next group on a wheeled table detached from the component mounting line, a step of calculating a production completion time until production of all boards of the next group is completed in consideration of the external setup work time, and a step of determining a group such that the production completion time is reduced. According to this, it is said that it is possible to determine a common arrangement group capable of obtaining higher productivity than in the related art.

PATENT LITERATURE

Patent Literature 1: JP-A-2018-116990

BRIEF SUMMARY

Technical Problem

Incidentally, in Patent Literature 1, productivity is increased by performing external setup work of disposing a feeder used in the next group on a wheeled table outside the line and mounting work of the current group in the component mounting line in parallel. However, unlike Patent Literature 1, there is a wheeled table capable of replacing a feeder in a state in which the wheeled table is provided in a component mounter. According to this, the type of setup change task is not limited to exchange work for a wheeled table, and it is also conceivable to perform work of replacing a feeder, work of performing exchange of wheeled tables and replacement of a feeder in parallel, or the like. That is, the types of setup change tasks are diversified.

Here, the type of efficient setup change task is changed depending on the types of components (component types) required for the current board type and the next board type. In the related art, the type of setup change task related to a wheeled table is set based on intuition or experience. However, an inexperienced operator is not necessarily able to set an efficient setup change task. Consequently, there is a problem that a stop time of a component mounter is extended and thus the productivity decreases. in a case where there is a constraint on an inventory number of available wheeled tables, it is further difficult to set an efficient setup change task within the constraint range.

An object of the present specification is to provide a setup change task setting device capable of setting an excellent setup change task related to a wheeled table supplying components without depending on intuition or experience of a skilled operator during a setup change for changing a board on which a component is mounted from a current board type to a next board type in a component mounter.

Solution to Problem

The present specification discloses a setup change task setting device including a number-of-feeders acquisition section configured to acquire the number of feeders required to be replaced in a wheeled table on which multiple feeders supplying components are installed to be replaceable during a setup change in which a board on which the components are mounted is changed from a current board type to a next board type in a component mounter in which the wheeled table is provided to be exchangeable; a task comparing section configured to compare relative merits of multiple types of setup change tasks in the wheeled table provided in the component mounter based on an acquisition result from the number-of-feeders acquisition section; and a task setting section configured to set any of the multiple types of setup change tasks for the wheeled table based on a comparison result from the task comparing section.

Advantageous Effects

In the setup change task setting device disclosed in the present specification, the number of feeders required to be replaced during a setup change is acquired, relative merits of multiple types of setup change tasks in a wheeled table provided in a component mounter are compared with each other based on the acquired number of feeders, and any of the setup change tasks is set for the wheeled table based on the comparison result. Here, as an evaluation scale for comparing the relative merits, a stop time of the component mounter or another evaluation scale is selected as appropriate. Therefore, an excellent setup change task related to a wheeled table supplying components can be automatically set without depending on intuition or experience of a skilled operator.

DESCRIPTION OF EMBODIMENTS

Figure 1:
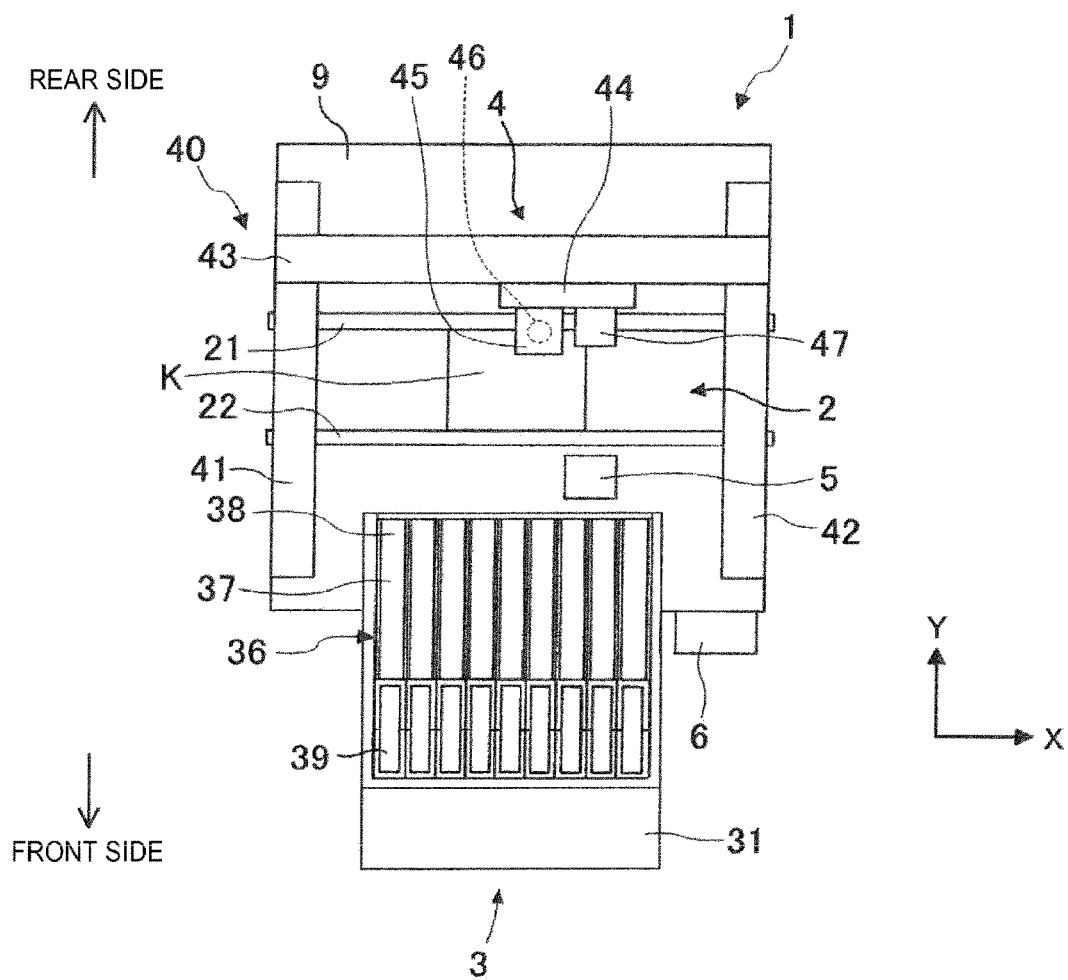
FIG. 1 is a plan view schematically illustrating a configuration example of a component mounter to which a setup change task setting device of an embodiment is applied.

1. Configuration Example of Component Mounter 1

First, a configuration example of component mounter 1 to which setup change task setting device 8 (refer to FIG. 3) of the embodiment is applied will be described with reference to FIG. 1 and FIG. 2. Component mounter 1 performs mounting work of mounting a component on board K. Component mounter 1 may be used alone, or a component mounting line may be configured by arranging multiple component mounters in a row. A direction from left toward right on the drawing surface in FIG. 1 in which board K is conveyed is an X-axis direction, and a direction from the bottom (front side) toward the top (rear side) on the drawing surface is a Y-axis direction. Component mounter 1 is configured by assembling board conveyance device 2, component supply device 3, component transfer device 4, component camera 5, control device 6, and the like to base 9.

Board conveyance device 2 includes a pair of guide rails 21 and 22, a pair of conveyor belts, a board clamping mechanism, and the like. The conveyor belts convey board K into a work execution position by being rotated along guide rails 21 and 22 in a state in which board K is placed on the conveyor belts. The board clamping mechanism pushes up board K at the work execution position to clamp and position board K. When component mounting work is finished, the board clamping mechanism releases board K. Subsequently, the conveyor belts convey out board K.

Component supply device 3 is configured by installing multiple feeders 36 to be replaceable with each other on wheeled table 31. Wheeled table 31 is provided to be exchangeable on the front side of base 9. Two wheeled tables 31 may be provided on the front side and the rear side of base 9, respectively. As illustrated in FIG. 2, wheeled table 31 includes vehicle body 32, arm member 33, pallet member 34, and the like. In FIG. 2, only one feeder 36 is installed on wheeled table 31. In normal use, multiple feeders 36 are installed on wheeled table 31 and are arranged in the width direction.

Vehicle body 32 is formed to be smaller than the width dimension of component mounter 1, and is disposed parallel to a floor surface. Vehicle body 32 has multiple moving casters 321 on the lower side. Height adjustment portion 322 is provided on each of the left and right sides of vehicle body 32. Handle 323 is erected upward from each height adjustment portion 322. Arm member 33 is provided to be able to adjust a height thereof from each height adjustment portion 322 toward an obliquely upper rear direction. Plate-shaped pallet member 34 is stretched horizontally over an upper part of the rear side of both arm members 33. Upright connecting portion 341 is provided on the rear side of pallet member 34.

Multiple slots 342 extending in the front-rear direction are formed on the upper surface of pallet member 34 to be arranged in the width direction. Feeder 36 is inserted and installed from the front side to the rear side of slots 342. A positioning portion and a connector are provided at positions corresponding to respective slots 342 of connecting portion 341. The positioning portion defines and fixes a position of feeder 36. The connector supplies power to feeder 36 and secures a communication path between feeder 36 and control device 6.

Figure 2:
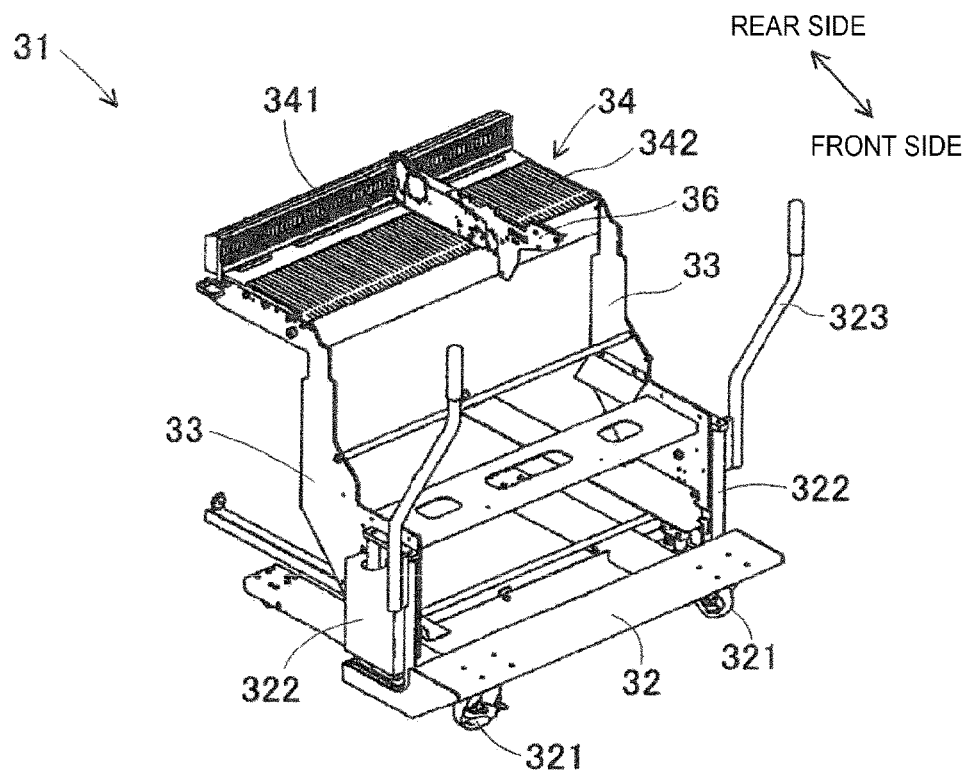
FIG. 2 is a perspective view of a wheeled table supplying components when viewed obliquely from the upper side.

As illustrated in FIG. 1, in feeder 36, reel 39 is loaded on a front side of main body portion 37. Predetermined supply position 38 for supplying components is set in an upper part closer to the rear side of main body portion 37. A carrier tape in which components are respectively housed in multiple cavities is wound around reel 39. Feeder 36 intermittently feeds the carrier tape with a tape feeding mechanism (not illustrated) to set a component at supply position 38. As a result, feeder 36 sequentially performs a component supplying operation.

Feeder 36 is assigned with identification information and is managed. The identification information is displayed with a label or the like on which a bar code is printed. A control section (not illustrated) of feeder 36 stores the identification information and has a function of transmitting the identification information using communication. As for information regarding the component type housed in reel 39, a label on which a bar code is printed is affixed to reel 39 to be displayed. The identification information or the information regarding the component type may be assigned to other display locations according to a display method other than the above methods.

Component transfer device 4 is disposed above board conveyance device 2 or component supply device 3. Component transfer device 4 picks up a component from component supply device 3 and mounts the component on board K. Component transfer device 4 includes head driving mechanism 40, moving table 44, mounting head 45, suction nozzle 46, mark camera 47, and the like. Head driving mechanism 40 is configured to include a pair of Y-axis rails 41 and 42, Y-axis slider 43, and a drive motor (not illustrated). Y-axis rails 41 and 42 extend parallel to each other in the Y-axis direction and are spaced apart from each other. Long Y-axis slider 43 in the X-axis direction is mounted over both Y-axis rails 41 and 42 and is moved in the Y-axis direction. Moving table 44 is mounted on Y-axis slider 43 and is moved in the X-axis direction. Head driving mechanism 40 drives Y-axis slider 43 in the Y-axis direction and drives moving table 44 on Y-axis slider 43 in the X-axis direction.

Moving table 44 holds mounting head 45 and mark camera 47. Mounting head 45 holds one or multiple suction nozzles 46 on the lower side and is driven by head driving mechanism 40 to be moved in two horizontal directions. Suction nozzle 46 is operated to perform lifting and lowering operations by being driven by a lifting/lowering driving section (not illustrated). Suction nozzle 46 is lowered from an upper side of the supply position 38, and performs a suction operation of suction-picking up a component due to the supply of a negative pressure. Suction nozzle 46 is driven above board K, and performs a mounting operation of mounting a component due to the supply of a positive pressure. There are multiple types of mounting heads 45 or suction nozzles 46, which are automatically or manually exchanged. Mark camera 47 images a position mark attached to positioned board K, and thus detects an accurate work execution position for board K.

Component camera 5 is provided to face upward on an upper surface of base 9 between board conveyance device 2 and component supply device 3. Component camera 5 images a component picked up by suction nozzle 46 while moving table 44 is moved from component supply device 3 to board K. An image processing section of component camera 5 performs image processing on acquired image data to determine the presence or absence of a component and the correctness of the component, and further acquires a suction posture of the component. A result of the image processing is reflected in a mounting operation for suction nozzle 46.

Control device 6 is assembled to base 9, and a disposition position thereof is not particularly limited. Control device 6 is configured by a computer device having a CPU and operated with software. Control device 6 may be configured such that multiple CPUs are distributed inside. Control device 6 controls component mounting work in accordance with job data 73 (refer to FIG. 3). The job data 73 differs depending on the type of board product to be produced (board type). Job data 73 includes information regarding a component type to be mounted on each board type.

2. Configuration Related to Control of Component Mounter 1 and Management Computer 7

Figure 3:
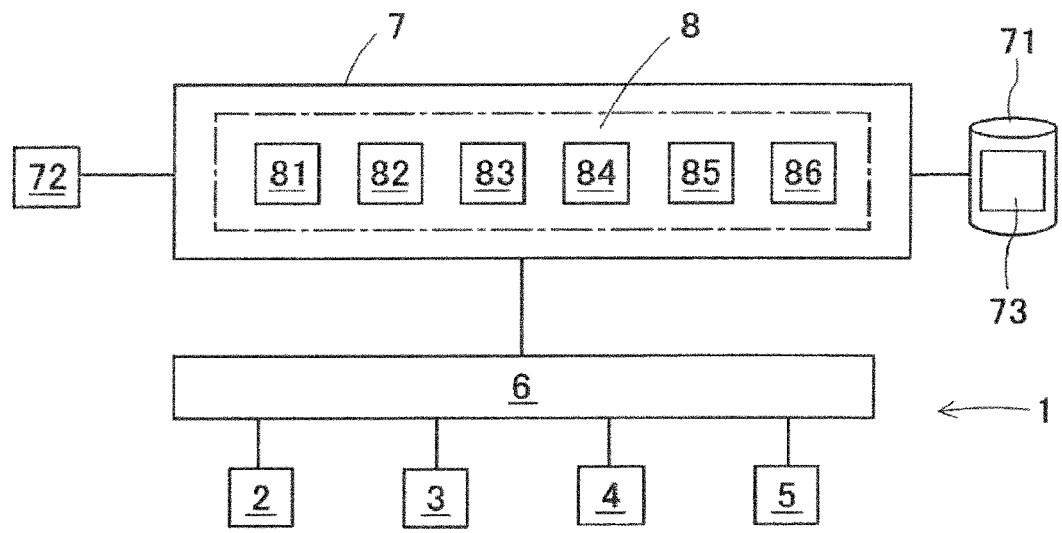
FIG. 3 is a block diagram illustrating a configuration of control related to the setup change task setting device.

As illustrated in FIG. 3, control device 6 controls board conveyance device 2, component supply device 3, component transfer device 4, and component camera 5. Management computer 7 is provided as an upper-level control device controlling component mounter 1. Control device 6 of component mounter 1 and management computer 7 are connected to each other through wired or wireless communication. Management computer 7 transmits a command related to mounting work to control device 6. Control device 6 transmits information a regarding progress state of the mounting work to management computer 7. Management computer 7 may collectively control multiple component mounters 1 and another type of board work machine.

Management computer 7 has storage device 71 storing various data such as job data 73 required for management. The data in storage device 71 may be attached to a command to be transmitted to control device 6, or may be accessible from control device 6.

Management computer 7 includes bar code reader 72 operated by an operator. bar code reader 72 reads a bar code displayed on feeder 36, to acquire the identification information of feeder 36. bar code reader 72 reads the bar code displayed on reel 39 to acquire information regarding a component type. The information acquired by bar code reader 72 is stored into storage device 71. In a case where a display method of the identification information and the information regarding the component type of feeder 36 is different from the bar code, a device other than bar code reader 72 is used in correspondence with the display method.

3. Setup Change Task Related to Wheeled Table 31

Next, the type of setup change task related to wheeled table 31 will be described. The setup change task related to wheeled table 31 is performed during a setup change for changing board K on which mounting work is performed from the current board type to the next board type. A purpose of this setup change task is to set up a component type required for the next board type. The setup change task includes three types of options such as 1) internal setup work, 2) exchange work for wheeled table 31, and 3) mixing work. The details of the work are as described below. The mixing work is not essential and may be excluded from the options.

1) Internal Setup Work

An operator replaces feeder 36 in wheeled table 31 provided in component mounter 1. First, the operator detaches feeder 36 that supplies a component type to be mounted on the current board type and not to be mounted on the next board type, that is, unnecessary feeder 36 from wheeled table 31. Next, the operator installs feeder 36 that supplies a component type not to be mounted on the current board type and to be mounted on the next board type, that is, feeder 36 required for the next board type on wheeled table 31. The time required to replace feeder 36 in one slot 342 of pallet member 34 is set as feeder replacement time tf.

In a case where there is a margin in the number of the slots 342 of pallet member 34, the operator need not detach the unnecessary feeder 36. For example, there is a case where, even if a component type to be mounted on the current board type is not to be mounted on the next board type, it may be known in advance that the component type is to be mounted on the board type after next. In this case, since the operator does not detach feeder 36 supplying the component type, it is not necessary to perform a reinstallation operation in the next setup change task. Feeder 36 is in an idle state in mounting work for the next board type. In a case where there is a margin in the number of the slots 342, the operator may install feeder 36 required for the next board type in advance in the preceding setup change task. In this case, feeder 36 is in an idle state in mounting work for the current board type.

2) Exchange Work for Wheeled Table 31

The operator detaches wheeled table 31 provided in component mounter 1, and provides another wheeled table 31. Another wheeled table 31 is required to be installed with feeder 36 required for the next board type. The time required for exchange work for wheeled table 31 is set as wheeled table exchange time td. In many cases, external setup work is necessary prior to the exchange work for wheeled table 31.

In the external setup work, the operator installs feeder 36 required for the next board type on wheeled table 31 in advance outside component mounter 1. The time required to install one feeder 36 is set as feeder installation time tt. In a case where unnecessary feeder 36 is detached from slot 342 prior to installation, feeder installation time tt is slightly longer. In a case where there has been a production record for the next board type in the past and wheeled table 31 used at that time has been stored in an available state, external setup work is not necessary.

3) Mixing Work

The operator performs both the above-described exchange work for wheeled table 31 and feeder reuse work. The feeder reuse work refers to reuse work in which feeder 36 required for a next board type is detached from wheeled table 31 that is detached in the exchange work, and is reinstalled on wheeled table 31 that is provided in the exchange work. The time required for the feeder reuse work for one feeder 36 is set as feeder reuse time tu.

4. Functions of Setup Change Task Setting Device 8 of Embodiment

A description will be made of functions of setup change task setting device 8 of the embodiment. As illustrated in FIG. 3, setup change task setting device 8 is realized by software of management computer 7. The present disclosure is not limited to this. Setup change task setting device 8 may be provided in control device 6 or in another computer communicatively connected to management computer 7. Setup change task setting device 8 includes six functional sections, that is, number-of-feeders acquisition section 81, task comparing section 82, task setting section 83, numberof-wheeled tables acquisition section 84, task changing section 85, and command changing section 86.

Setup change task setting device 8 is intended for one or two wheeled tables 31 to be provided in one component mounter 1, or multiple wheeled tables 31 to be used for a component mounting line. Here, in a case where there is a sufficient margin in an inventory number of available wheeled tables 31 and there are substantially no constraints, number-of-wheeled tables acquisition section 84 and task changing section 85 may be omitted. Command changing section 86 may be omitted.

Number-of-feeders acquisition section 81 acquires number nf of feeders 36 required to be replaced in wheeled table 31 during a setup change for changing a board type from the current board type to the next board type. Number-of-feeders acquisition section 81 can easily acquire number nf based on a difference between the component types by comparing two pieces of job data 73 corresponding to the current board type and the next board type with each other.

Task comparing section 82 compares relative merits of the setup change task in wheeled table 31 provided in component mounter 1 based on number nf acquired by number-of-feeders acquisition section 81. As evaluation scales for comparing the relative merits, stop time Ts of component mounter 1, total work times (Twi, Twc, and Twm) of the setup change task, the degree of utilization and the degree of constraint of feeder 36 and reel 39, and the like are used. Task comparing section 82 may compare relative merits in comprehensive consideration of multiple evaluation scales.

Stop time Ts of component mounter 1 in the internal setup work coincides with internal setup time Tin required for the internal setup work. In a case of one operator, internal setup time Tin is obtained by multiplying feeder replacement time tf by number nf. Stop time Ts in the exchange work for wheeled table 31 coincides with wheeled table exchange time td. Stop time Ts in the mixing work is obtained by multiplying feeder reuse time to by number nu of reused feeders 36, and further adding wheeled table exchange time td to the multiplication result. In a case where two or more operators execute the internal setup work or the feeder reuse work in parallel, stop time Ts is reduced compared with the above. Stop time Ts of component mounter 1 is preferably short.

Total work time Twi of the internal setup work is obtained by multiplying feeder replacement time tf by number nf. In a case of one operator, total work time Twi coincides with stop time Ts and internal setup time Tin. Total work time Twc in the exchange work for wheeled table 31 is obtained by adding wheeled table exchange time td to total work time Two of the external setup work. Total work time Two of the external setup work is obtained by multiplying feeder installation time tt by number nt of feeders 36 to be installed. Total work time Twm in the mixing work is obtained by multiplying feeder reuse time to by number nu of reused feeders 36, and further adding wheeled table exchange time td and total work time Two of the external setup work to the multiplication result. Total work times (Twi, Twc, and Twm) of the setup change task are preferably short.

The degree of utilization of feeder 36 and reel 39 is an evaluation scale indicating the degree of effective utilization without causing feeder 36 and reel 39 to stay. For example, in a case where the exchange work for wheeled table 31 is performed even though there is a common component type to be mounted on the current board type and the next board type, feeders 36 supplying the common component type to both wheeled tables 31 to be exchanged are required. That is, multiple feeders 36 and reels 39 are set up for one common component type.

As a result, when the production of the next board type is finished, multiple reels 39 are made usable, and further, two feeders 36 loaded with usable reels 39 remain. As a result, usable reels 39 stay and need to be stored for a long time, and thus the degree of utilization decreases. Long-term storage of reels 39 is not preferable in view of concern that the reliability of a component may be reduced or storage cost may be increased. Two feeders 36 cannot be used for other component types unless usable reels 39 are detached, and thus the degree of utilization decreases.

On the other hand, the degree of constraint of feeder 36 and reel 39 is an evaluation scale indicating the constraint on the number of feeders 36 and reels 39. For example, when an inventory number of available feeders 36 is smaller than the total number of slots 342 of wheeled table 31, feeders 36 cannot be installed in all slots 342 in the external setup work.

For example, in a case where there is only one reel 39 supplying components of a common component type, it is inevitably necessary to reuse feeder 36 loaded with reel 39. Even if there is another inventory of reels 39, reuse of reels 39 and feeder 36 may be selected in order to avoid staying of usable reels 39 or to secure an inventory number of feeders 36. As described above, the type of excellent setup change task related to wheeled table 31 changes according to the degree of utilization or the degree of constraint of feeder 36 and reel 39.

Task setting section 83 sets any of the setup change tasks for wheeled table 31 based on the comparison result from task comparing section 82. For example, in a case where stop time Ts of component mounter 1 is used as the evaluation scale, task setting section 83 sets the internal setup work for wheeled table 31 for which internal setup time Tin is less than wheeled table exchange time td. Task setting section 83 sets the exchange work for wheeled table 31 for which internal setup time Tin is equal to or more than wheeled table exchange time td. Qualitatively, the internal setup work is set when number nf is smaller than a certain threshold number, and the exchange work for wheeled table 31 is set when number nf is equal to or greater than the threshold number.

In a case where the exchange work for wheeled table 31 is set, task setting section 83 also sets the external setup work for wheeled table 31 that is a target to be provided in the exchange work. Task setting section 83 sets the mixing work as necessary in a case where there are conditions such as the degree of utilization or the degree of constraint of feeder 36 and reel 39. That is, task setting section 83 sets the feeder reuse work in conjunction with the exchange work for wheeled table 31.

Number-of-wheeled tables acquisition section 84 acquires inventory number NS of available wheeled tables 31 not provided in component mounter 1. For example, number-of-wheeled tables acquisition section 84 displays an input screen to request the operator to perform an input operation, and acquires information regarding input inventory number NS. A bar code indicating the identification information may be attached to wheeled table 31 such that a usage status of wheeled table 31 is managed by management computer 7. In this aspect, number-of-wheeled tables acquisition section 84 can easily acquire inventory number NS based on the usage status of wheeled table 31.

Task changing section 85 changes the exchange work set for excess wheeled table 31 to the internal setup work when number NR of wheeled tables 31 for which the exchange work is set by task setting section 83 exceeds inventory number NS. That is, when wheeled table 31 is insufficient, task changing section 85 sets the exchange work such that wheeled tables 31 of inventory number NS are used up. Task changing section 85 changes and sets an excess amount (=NR−NS) of wheeled tables 31 to the internal setup work.

Task changing section 85 sequentially performs change setting from wheeled tables 31 in which the number of feeders 36 to be replaced is small among wheeled tables 31 for which the exchange work is set. Consequently, the number of feeders 36 to be replaced by the internal setup work is minimized, and thus total work time Twi of the internal setup work is minimized. Stop time Ts of component mounter 1 is minimized. When number NR is equal to or smaller than inventory number NS, wheeled table 31 is not insufficient, and task changing section 85 does not function.

Command changing section 86 changes the type of setup change task set for wheeled table 31 in accordance with a command from the operator. That is, the operator can afterward change a method of the setup change task set by task setting section 83 or task changing section 85. For example, the operator may issue a command while comprehensively taking into consideration evaluation scales not used by setup change task setting device 8. Consequently, the type of setup change task can be flexibly set, and thus it is also possible to cope according to circumstances. Each function of the six functional sections will be described in the following description of operations.

5. Operations and Actions of Setup Change Task Setting Device 8

Figure 5:
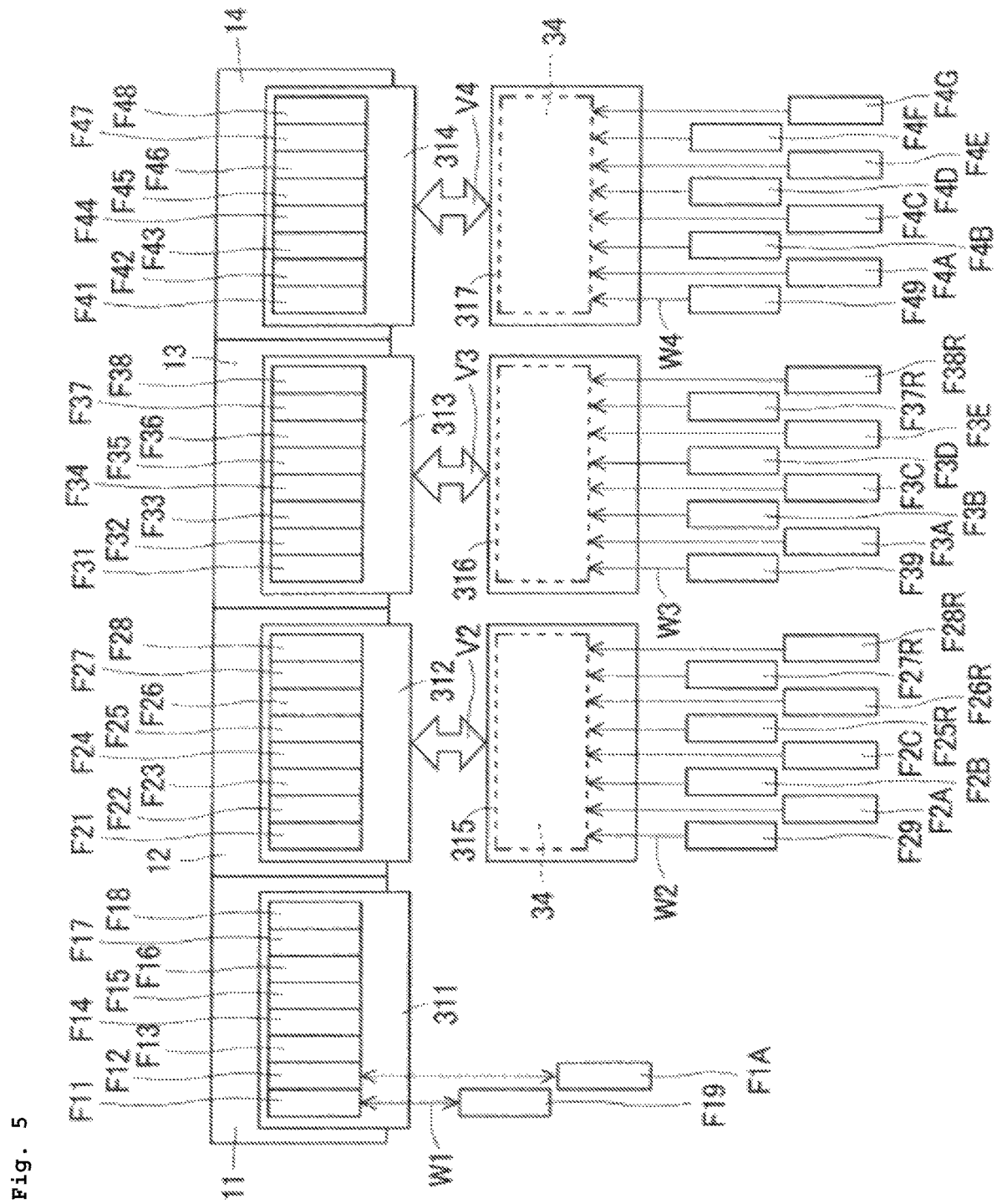
FIG. 5 is a diagram illustrating a setting example of a setup change task in a component mounting line.
Figure 6:
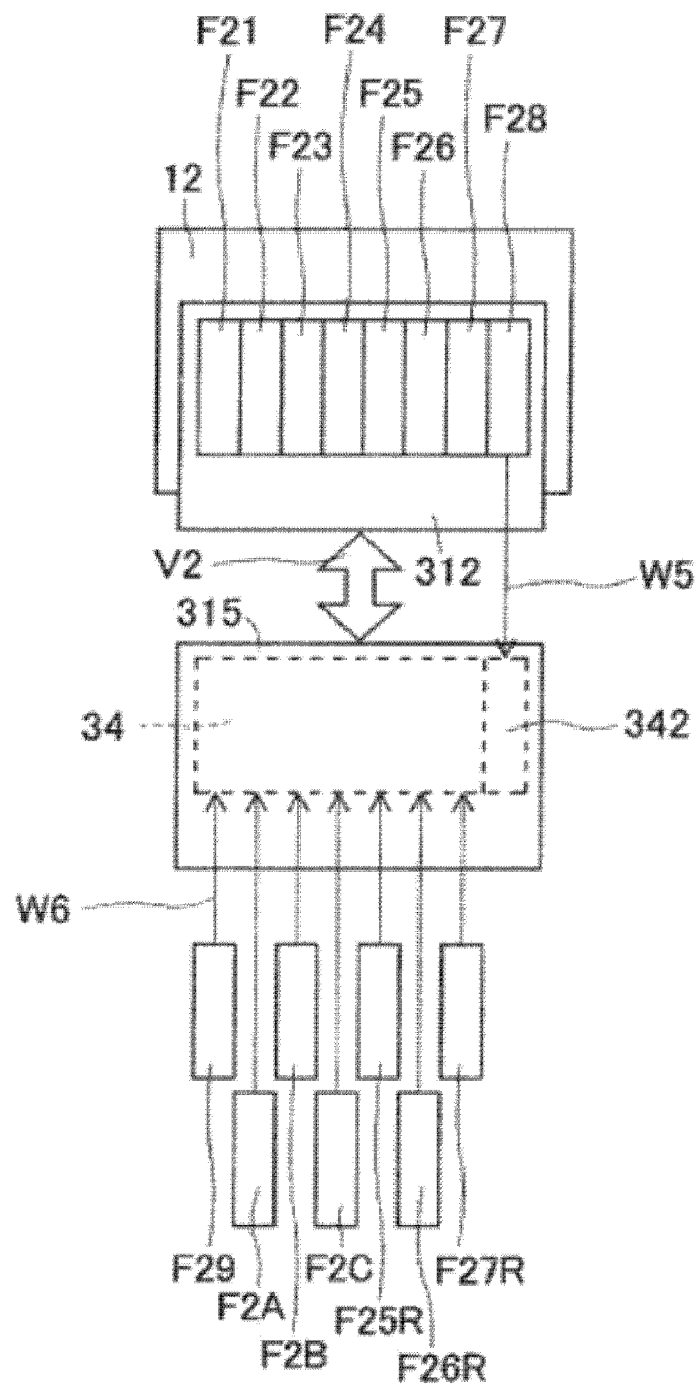
FIG. 6 illustrates an application example of setting a setup change task.

Next, operations and actions of the setup change task setting device 8 according to the embodiment will be described with reference to FIGS. 4 to 6. In order to simplify the following descriptions, a configuration in which a component mounting line is configured by arranging four component mounters such as first to fourth component mounters (11 to 14) in a row and eight feeders 36 are installed on each wheeled table 31 is assumed. Actually, multiple feeders 36 are installed on wheeled table 31.

It is assumed that one operator performs a setup change task. It is assumed that feeder replacement time tf is 30 seconds, feeder installation time tt is 10 seconds, and feeder reuse time to is 40 seconds. Wheeled table exchange time td is assumed to be 70 seconds. According to these assumptions, total work time Two of the external setup work is Two=tt×nt=10×8=80 seconds.

Figure 4:
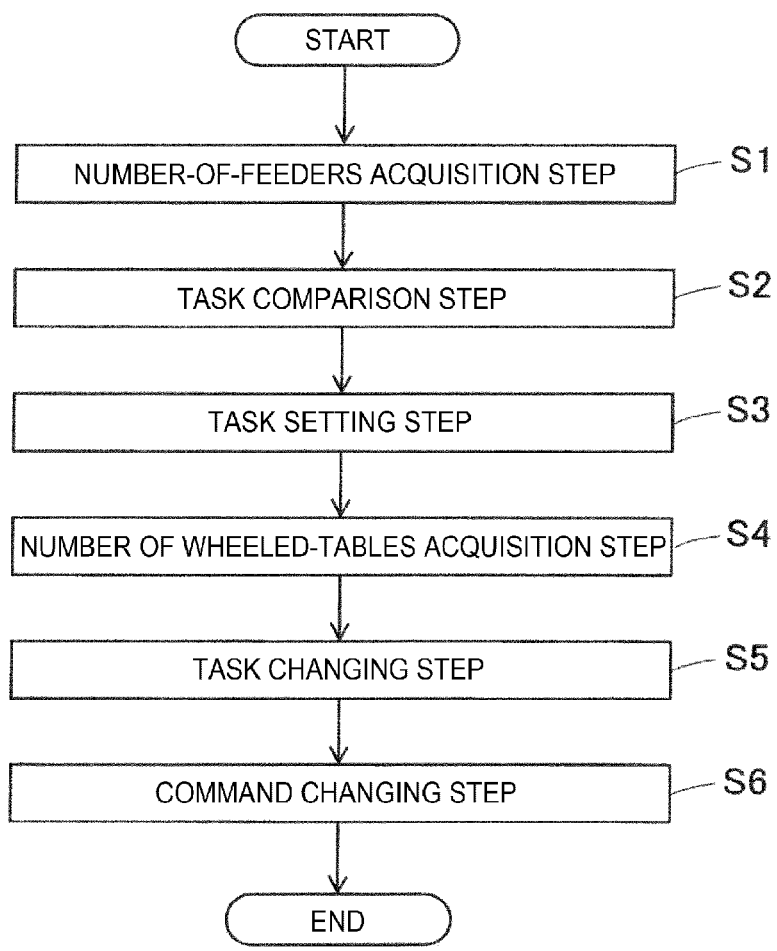
FIG. 4 is a diagram illustrating an operation flow of the setup change task setting device.

An operation flow for the setup change task setting device 8 illustrated in FIG. 4 is executed at an earlier time than the production of the next board type is started, and is preferably executed immediately after the current board type and the next board type are determined. In other words, it is preferable that this operation flow is executed immediately after number of of feeders 36 that need to be replaced at the time of a setup change is specified. As a result, the operator can execute the external setup work in parallel with mounting work for the current board type in the first to fourth component mounters (11 to 14), and complete the external setup work before the production of the current board type is finished.

Therefore, in a case where the exchange work for wheeled table 31 is set, stop time Ts of the first to fourth component mounters (11 to 14) need only to be wheeled table exchange time td. If the execution of the operation flow is delayed, a situation occurs in which the external setup work is not completed even if the production of the current board type is finished. in this case, since the exchange work for wheeled table 31 cannot be immediately performed, stop time Ts of the first to fourth component mounters (11 to 14) is unnecessarily extended.

In number-of-feeders acquisition step S1 in FIG. 4, number-of-feeders acquisition section 81 acquires number of of feeders 36 required to be replaced in each of the wheeled tables (311 to 314) of the first to fourth component mounters (11 to 14). In the example illustrated in FIG. 5, eleventh to eighteenth feeders (F11 to F18) required for the current board type are installed on first wheeled table 311 of first component mounter 11. Feeders 36 required for the next board type are thirteenth to eighteenth feeders (F13 to F18), nineteenth feeder F19, and a 1A-th feeder. Thus, it is necessary to replace eleventh feeder F11 and twelfth feeder F12 with nineteenth feeder F19 and 1A-th feeder F1A. Therefore, number nf is 2.

Twenty-first to twenty-eighth feeders (F21 to F28) are installed on second wheeled table 312 of second component mounter 12. It is necessary to replace twenty-first to twenty-fourth feeders (F21 to F24) with twenty-ninth to 2C-th feeders (F29 to F2C). Therefore, number nf is four. Thirty-first to thirty-eighth feeders (F31 to F38) are installed on third wheeled table 313 of third component mounter 13. It is necessary to replace thirty-first to thirty-sixth feeders (F31 to F36) with thirty-ninth to 3E-th feeders (F39 to F3E). Therefore, number nf is six. Forty-first to forty-eighth feeders (F41 to F48) are installed on fourth wheeled table 314 of fourth component mounter 14. It is necessary to replace all of feeders 36 with forty-ninth to 4G-th feeders (F49 to F4G). Therefore, number nf is eight.

In the next task comparison step S2, task comparing section 82 compares relative merits between the internal setup change task and the exchange work for first to fourth wheeled tables (311 to 314) with respect to respective first to fourth component mounters (11 to 14). In a case where stop time Ts of first to fourth component mounters (11 to 14) is used as the evaluation scale, task comparing section 82 calculates internal setup times Tin1 to Tin4 with respect to respective first to fourth wheeled tables (311 to 314).

Internal setup time Tin1 of first wheeled table 311 is Tin1=tf×nf=30×2=60 seconds. According to the same calculation formula, internal setup time Tin2 of the second wheeled table 312 is 30×4=120 seconds. Internal setup time Tin3 of the third wheeled table 313 is 30×6=180 seconds. Internal setup time Tin4 of the fourth wheeled table 314 is 30×8=240 seconds. On the other hand, the exchange work for first to fourth wheeled tables (311 to 314) requires the same wheeled table exchange time td (=70 seconds).

In the next task setting step S3, task setting section 83 sets the internal setup work or the exchange work for first to fourth wheeled tables (311 to 314) based on the comparison result from task comparing section 82. Task setting section 83 sets the internal setup work for first wheeled table 311 for which internal setup time Tin1 (=60 seconds) is less than wheeled table exchange time td (=70 seconds). Specifically, task setting section 83 sets the internal setup work of replacing eleventh feeder F11 with nineteenth feeder F19 and replacing twelfth feeder F12 with 1A-th feeder F1A (refer to arrow W1).

Task setting section 83 sets the exchange work for second to fourth wheeled tables (312 to 314) for which internal setup times (Tin2, Tin3, and Tin4) are equal to or more than wheeled table exchange time td (refer to white arrows V2, V3, and V4). Number NR of wheeled tables 31 for which the exchange work is set is three. In the above example, a threshold number for separating the internal setup work from the exchange work for wheeled table 31 is three.

Task setting section 83 sets the external setup work for the fifth to seventh wheeled tables (315 to 317) to be provided in the exchange work. Specifically, task setting section 83 sets the external setup work for fifth wheeled table 315 to be provided by detaching second wheeled table 312. Task setting section 83 sets another four 25R-th to 28R-th feeders (F25R to F28R) supplying the same component type as twenty-fifth to twenty-eighth feeders (F25 to F28) and four twenty-ninth to 2C-th feeders (F29 to F2C) to be installed (refer to arrow W2).

Task setting section 83 sets another two 37R-th and 38R-th feeders (F37R and F38R) and six thirty-ninth to 3E-th feeders (F39 to F3E) supplying the same component type as the thirty-seventh and thirty-eighth feeders (F37, F38) to be installed in the external setup work for sixth wheeled table 316 that is provided by detaching third wheeled table 313 (refer to arrow W3). Task setting section 83 sets eight forty-ninth to 4G-th feeders (F49 to F4G) to be installed in the external setup work for seventh wheeled table 317 that is provided by detaching fourth wheeled table 314 (refer to arrow W4).

In the next number-of-wheeled tables acquisition step S4, number-of-wheeled tables acquisition section 84 acquires inventory number NS of available wheeled tables 31. In the next task changing step S5, first, task changing section 85 compares number NR (=3) of wheeled tables 31 for which the exchange work is set with inventory number NS. When inventory number NS is three or more, wheeled table 31 is not insufficient, and task changing section 85 does not function.

When inventory number NS is two, task changing section 85 changes and sets second wheeled table 312 having the smallest number of four feeders 36 to be replaced among second to fourth wheeled tables (312 to 314) for which the exchange work is set to the internal setup work. When inventory number NS is one, task changing section 85 changes and sets second wheeled table 312 and third wheeled table 313 to the internal setup work in accordance with the order in which the number of feeders 36 to be replaced is as small as four and six among second to fourth wheeled tables (312 to 314). In FIG. 5, a case where inventory number NS is three or more is illustrated, and the internal setup work for second wheeled table 312 and third wheeled table 313 is not illustrated.

In the next command changing step S6, command changing section 86 checks whether or not there is a command from the operator. For example, in a case where there is a command for "the internal setup work for second wheeled table 312", command changing section 86 changes the exchange work for the second wheeled table 312 to the internal setup work in accordance with the command. As a result of the above-described operation, setup change task setting device 8 finally determines the type of setup change task for first to fourth wheeled tables (311 to 314), and presents the determined type to the operator.

In a case where total work times (Twi, Twc, and Twm) of the setup change task are used as the evaluation scales, settings different from the above descriptions are made. That is, in task comparison step S2, task comparing section 82 calculates total work times (Twi1 to Twi4) of the internal setup work and total work times (Twc1 to Twc4) in the exchange work for first to fourth wheeled tables (311 to 314) with respect to respective first to fourth wheeled tables (311 to 314).

In first wheeled table 311, total work time Twi1 of the internal setup work is tf×nf=30×2=60 seconds. Total work time Twc1 in the exchange work for first wheeled table 311 is td+Two=70+80=150 seconds. Therefore, task setting section 83 sets the internal setup work on the side where total work time Twi1 is smaller for first wheeled table 311.

In second wheeled table 312, total work time Twi2 of the internal setup work is 30×4=120 seconds. Total work time Twc2 in the exchange work for second wheeled table 312 is 150 seconds that is equal to total work time Twc1. Therefore, task setting section 83 sets the internal setup work on the side where total work time Twi2 is smaller for second wheeled table 312. This setting is different from that in a case where stop time Ts of component mounter 1 is used as the evaluation scale.

In third wheeled table 313, total work time Twi3 of the internal setup work is 30×6=180 (seconds). Total work time Twc3 in the exchange work for third wheeled table 313 is 150 seconds that is equal to total work time Twc1. Therefore, task setting section 83 sets the exchange work on the side where total work time Twc3 is smaller for third wheeled table 313. In fourth wheeled table 314, total work time Twi4 of the internal setup work is 30×8=240 seconds. Total work time Twc4 in the exchange work for fourth wheeled table 314 is 150 seconds that is equal to total work time Twc1. Therefore, task setting section 83 sets the exchange work on the side where total work time Twc4 is smaller for fourth wheeled table 314.

Next, an application example illustrated in FIG. 6 will be described. In this application example, a case where only one reel 39 capable of supplying a common component type to be mounted on the current board type and the next board type is loaded on twenty-eighth feeder F28 of second component mounter 12 is assumed. In this case, it is inevitably necessary to reuse twenty-eighth feeder F28. Task setting section 83 sets reuse work (refer to arrow W5) for twenty-eighth feeder F28 in conjunction with the exchange work for the second wheeled table 312 (refer to white arrow V2).

Task setting section 83 sets the external setup work for feeders other than the twenty-eighth feeder F28. That is, task setting section 83 sets another three 25R-th to 27R-th feeders (F25R to F27R) that supply the same component type as twenty-fifth to twenty-seventh feeders (F25 to F27), and four twenty-ninth to 2C-th feeders (F29 to F2C) to be installed on fifth wheeled table 315 (refer to arrow W6).

In an actual setup change task, slot 342 in which twenty-eighth feeder F28 of fifth wheeled table 315 is to be installed remains empty. As indicated by arrow W5 in FIG. 6, t twenty-eighth feeder F28 is detached from second wheeled table 312, is installed on fifth wheeled table 315 to be reused. Multiple feeders 36 may be reused.

In setup change task setting device 8 of the embodiment, number of of feeders 36 required to be replaced during a setup change is acquired, relative merits of multiple types of setup change tasks in wheeled tables (31 and 311 to 314) provided in the component mounters (1 and 11 to 14) are compared based on the acquired number, and any of the setup change tasks is set for wheeled tables (31 and 311 to 314) based on the comparison result. Here, stop time Ts of component mounters (1 and 11 to 14) and other evaluation scales are appropriately selected as evaluation scales for comparing the relative merits. Therefore, an excellent setup change task for wheeled tables (31 and 311 to 314) supplying components is automatically set without depending on the intuition or experience of a skilled operator.

5. Applications and Modifications of Embodiment

The numerical values of feeder replacement time tf, feeder installation time tt, feeder reuse time tu, and wheeled table exchange time td are assumed for the sake of simplicity, and different numerical values may be employed. When a procurement timing of a certain component type is delayed, task setting section 83 can set a setup change task different from that in the embodiment. That is, task setting section 83 may set a setup change task in which the external setup work and the exchange work for wheeled table 31 except for specific feeder 36 supplying the component type are made to proceed, and, after the component type is procured, specific feeder 36 is installed on wheeled table 31 provided in component mounter 1. The embodiment may be variously applied or modified.

REFERENCE SIGNS LIST

1: Component mounter, 11 to 14: First to fourth component mounters, 3: Component supply device, 31: Wheeled table, 311 to 317: First to seventh wheeled tables, 34: Pallet member, 342: Slot, 36: Feeder, 39: Reel, 4: Component transfer device, 6: Control device, 7: Management computer, 73: Job data, 8: Setup change task setting device, 81: Number-of-feeders acquisition section, 82: Task comparing section, 83: Task setting section, 84: Number-of-wheeled tables acquisition section, 85: Task changing section, 86: Command changing section, K: Board

The invention claimed is:

1. A setup change task setting device, comprising:
a number-of-feeders acquisition section configured to acquire a number of feeders required to be replaced in a wheeled table on which multiple feeders supplying components are installed to be replaceable during a setup change in which a board on which the components are mounted is changed from a current board type to a next board type in a component mounter in which the wheeled table is provided;
a task comparing section configured to compare relative merits of multiple types of setup change tasks in the wheeled table provided in the component mounter based on an acquisition result from the number-of-feeders acquisition section; and
a task setting section configured to set any of the multiple types of setup change tasks for the wheeled table based on a comparison result from the task comparing section, wherein
the task comparing section compares an internal setup time for an internal setup work of replacing the feeders in the wheeled table provided in the component mounter, a wheeled table exchange time required for an exchange work for exchanging the wheeled table, and a mixing work time for a mixing work of adding feeder reuse work to the exchange work including detaching the feeder required for the next board type from the wheeled table that is to be detached in the exchange work and reinstalling the feeder on the wheeled table that is to be provided in the exchange work;
the task setting section sets any of the internal setup work, the exchange work for the wheeled table, and the mixing work in addition to the exchange work as the setup change task for the wheeled table, wherein the task setting section sets the internal setup work for the wheeled table for which the internal setup time is less than the wheeled table exchange time, and sets the exchange work for the wheeled table for which the internal setup time is equal to or more than the wheeled table exchange time.

2. The setup change task setting device according to claim 1, wherein
the task comparing section multiplies a feeder replacement time required to replace one of the feeders by the number of the feeders to be replaced to estimate the internal setup time.

3. The setup change task setting device according to claim 1, wherein
the task setting section sets in advance external setup work of installing the feeder required for the next board type outside the component mounter for the wheeled table to be provided in the exchange work.

4. The setup change task setting device according to claim 1, further comprising:
a command changing section configured to change a type of setup change task set for the wheeled table in accordance with a command from an operator.

5. A setup change task setting device, comprising:
a number-of-feeders acquisition section configured to acquire a number of feeders required to be replaced in a wheeled table on which multiple feeders supplying components are installed to be replaceable during a setup change in which a board on which the components are mounted is changed from a current board type to a next board type in a component mounter in which the wheeled table is provided;
a task comparing section configured to compare relative merits of multiple types of setup change tasks in the wheeled table provided in the component mounter based on an acquisition result from the number-of-feeders acquisition section;
a number-of-wheeled tables acquisition section configured to acquire an inventory number of available wheeled tables that are not provided in the component mounter;
a task setting section configured to set any of the multiple types of setup change tasks for the wheeled table based on a comparison result from the task comparing section, wherein
the task comparing section compares an internal setup time for an internal setup work of replacing the feeders in the wheeled table provided in the component mounter and a wheeled table exchange time required for an exchange work for exchanging the wheeled table,
the task setting section sets the internal setup work for the wheeled table for which the internal setup time is less than the wheeled table exchange time, and sets the exchange work for the wheeled table for which the internal setup time is equal to or more than the wheeled table exchange time, and
a task changing section changes the exchange work set for excess wheeled tables to the internal setup work when the number of wheeled tables for which the exchange work is set by the task setting section exceeds the inventory number.

6. The setup change task setting device according to claim 5, wherein
the task changing section sequentially performs change setting for the wheeled tables in which the number of feeders to be replaced is small among the wheeled tables for which the exchange work is set.

7. A setup change task setting device, comprising: processing circuitry configured to:
acquire a number of feeders required to be replaced in a wheeled table on which multiple feeders supplying components are installed to be replaceable during a setup change in which a board on which the components are mounted is changed from a current board type to a next board type in a component mounter in which the wheeled table is provided,
compare multiple types of setup change tasks in the wheeled table provided in the component mounter based on the number of feeders required to be replaced,
set any of the multiple types of setup change tasks for the wheeled table based on a comparison result of comparing the multiple types of set change tasks,
compare an internal setup time for an internal setup work of replacing the feeders in the wheeled table provided in the component mounter, a wheeled table exchange time required for an exchange work for exchanging the wheeled table, and a mixing work time for a mixing work of adding feeder reuse work to the exchange work including detaching the feeder required for the next board type from the wheeled table that is to be detached in the exchange work and reinstalling the feeder on the wheeled table that is to be provided in the exchange work,
set any of the internal setup work, the exchange work for the wheeled table, and the mixing work in addition to the exchange work, wherein the internal setup work for the wheeled table for which is set when the internal setup time is less than the wheeled table exchange time, and the exchange work for the wheeled table is set when the internal setup time is equal to or more than the wheeled table exchange time.

* * * * *